United States Patent
Seff et al.

(10) Patent No.: US 9,525,247 B2
(45) Date of Patent: Dec. 20, 2016

(54) INTERLOCKING OUTLET AND ASSOCIATED METHOD

(71) Applicant: EATON CORPORATION, Cleveland, OH (US)

(72) Inventors: Paul David Seff, Williamsburg, VA (US); Christopher Emmons Drueke, Williamsburg, VA (US); Jason Demetrios Easton, Williamsburg, VA (US); Tyler Devon Young, Yorktown, VA (US)

(73) Assignee: EATON CORPORATION, Cleveland, OH (US)

( * ) Notice: Subject to any disclaimer, the term of this patent is extended or adjusted under 35 U.S.C. 154(b) by 0 days.

(21) Appl. No.: 14/644,427

(22) Filed: Mar. 11, 2015

(65) Prior Publication Data

US 2016/0268742 A1 Sep. 15, 2016

(51) Int. Cl.
*H01R 13/66* (2006.01)
*G01R 31/02* (2006.01)
*G01R 19/165* (2006.01)
*H01H 71/10* (2006.01)

(52) U.S. Cl.
CPC ......... *H01R 13/6683* (2013.01); *G01R 19/165* (2013.01); *G01R 31/025* (2013.01); *H01H 71/10* (2013.01); *H01H 2221/016* (2013.01)

(58) Field of Classification Search
CPC .................................................. H01R 13/6683
See application file for complete search history.

(56) References Cited

U.S. PATENT DOCUMENTS

| 5,650,771 | A | * | 7/1997 | Lee | G01R 15/12 340/538.17 |
| --- | --- | --- | --- | --- | --- |
| 5,737,168 | A | * | 4/1998 | Baker | H02H 3/207 361/84 |
| 5,814,955 | A | * | 9/1998 | Bauer | H02H 7/09 318/376 |
| 5,973,896 | A | * | 10/1999 | Hirsh | H02H 11/005 361/54 |
| 6,049,143 | A | * | 4/2000 | Simpson | H01R 13/7039 307/126 |
| 6,052,265 | A | * | 4/2000 | Zaretsky | H02H 3/338 340/638 |
| 6,525,914 | B1 | * | 2/2003 | Legatti | H02H 3/334 361/42 |
| 6,597,144 | B2 | * | 7/2003 | Pearson | D06F 33/02 318/599 |

(Continued)

OTHER PUBLICATIONS

D65 Series Voltage Monitoring Relay Product Installation Leaflet, Eaton.com, May 2015.*
D65 monitoring relays pdf file, Eaton.com.*

*Primary Examiner* — Ross Gushi
(74) *Attorney, Agent, or Firm* — Eckert Seamans; Nathaniel Wilks; Grant Coffield

(57) ABSTRACT

An interlocking outlet includes terminals configured to electrically connect to a power source; a receptacle structured to receive a plug; at least one sensor; and a control unit structured to determine whether an electrical condition is met and the plug is physically inserted into the receptacle based on outputs of the at least one sensor and to electrically connect the receptacle to the terminals when the electrical condition is met and the plug is physically inserted into the receptacle to energize the receptacle.

20 Claims, 5 Drawing Sheets

(56) References Cited

U.S. PATENT DOCUMENTS

| | | | | |
|---|---|---|---|---|
| 6,662,124 B2* | 12/2003 | Schweitzer, III | .... | H02H 1/0007 324/76.15 |
| 6,693,810 B2* | 2/2004 | Robinson | ........ | H02J 9/061 363/21.01 |
| 6,845,333 B2* | 1/2005 | Anderson | ........ | H02H 1/0007 324/76.11 |
| 7,400,476 B1* | 7/2008 | Hull, Jr. | ........ | H02H 11/002 361/42 |
| 7,505,237 B2* | 3/2009 | Baxter | ........ | H02H 11/005 361/42 |
| 7,928,609 B2* | 4/2011 | Cruz | ........ | H02H 3/12 307/326 |
| 8,129,868 B2* | 3/2012 | Cruz | ........ | H02H 3/12 307/326 |
| 9,231,353 B2* | 1/2016 | Lee | ........ | H01R 13/6683 |
| 2008/0049367 A1* | 2/2008 | Carson | ........ | H02H 3/12 361/87 |
| 2008/0265677 A1* | 10/2008 | Chiang | ........ | H01R 13/6683 307/38 |
| 2009/0167537 A1* | 7/2009 | Feliss | ........ | B60L 3/0069 340/584 |
| 2009/0225480 A1* | 9/2009 | Baxter | ........ | H02H 11/005 361/42 |
| 2009/0315409 A1* | 12/2009 | Wheeler | ........ | H01R 13/665 307/126 |
| 2012/0302092 A1* | 11/2012 | Kaps | ........ | H01R 13/6683 439/535 |
| 2013/0001052 A1 | 1/2013 | Kantor | | |
| 2013/0015706 A1* | 1/2013 | Chien | ........ | G06F 1/266 307/38 |
| 2013/0140894 A1* | 6/2013 | Lee | ........ | H01R 13/6683 307/39 |
| 2013/0154808 A1* | 6/2013 | Han | ........ | H01R 13/465 340/10.5 |
| 2013/0162053 A1* | 6/2013 | Iizuka | ........ | H01H 47/00 307/140 |
| 2013/0194734 A1* | 8/2013 | Yoshikawa | ........ | H01R 13/641 361/679.01 |
| 2013/0301165 A1* | 11/2013 | Ford | ........ | H01R 13/6683 361/2 |
| 2013/0313899 A1* | 11/2013 | Soneda | ........ | G01R 21/133 307/11 |
| 2013/0317770 A1* | 11/2013 | Soneda | ........ | H01R 13/6683 702/61 |
| 2013/0338844 A1* | 12/2013 | Chan | ........ | H01R 13/6683 700/295 |
| 2014/0120764 A1* | 5/2014 | Valadas | ........ | G02B 6/3817 439/488 |
| 2014/0187078 A1* | 7/2014 | Zhou | ........ | H01R 13/641 439/489 |
| 2014/0191573 A1* | 7/2014 | Chen | ........ | H04Q 9/00 307/35 |
| 2014/0285019 A1* | 9/2014 | Gelonese | ........ | G06F 1/325 307/39 |
| 2015/0244121 A1* | 8/2015 | Amelio | ........ | H01R 24/78 439/345 |
| 2015/0255932 A1* | 9/2015 | Dicks | ........ | H01R 13/6666 307/326 |
| 2015/0280369 A1* | 10/2015 | Chen | ........ | H01R 13/703 439/188 |
| 2015/0316589 A1* | 11/2015 | Mazara Diaz | ....... | G01R 19/165 324/114 |
| 2015/0325960 A1* | 11/2015 | Tsai | ........ | H01R 13/6658 439/217 |

* cited by examiner

INTERLOCKING OUTLET AND ASSOCIATED METHOD

BACKGROUND

1. Field

The disclosed concept pertains generally to outlets, and, more particularly, to interlocking outlets. The disclosed concept also pertains to methods of operating interlocking outlets.

2. Background Information

Interlocking outlets such as, without limitation, reefer outlets, are intended to only energize their receptacle when a corresponding plug in inserted into the receptacle.

Prior interlocking outlets have used a mechanical plunger to energize the receptacle. One example of such an interlocking outlet is shown and described in U.S. Patent Application Publication No. 2013/0001052. In such interlocking outlet designs, actuating the plunger would cause the receptacle to be energized or de-energized. Thus, after the plug is inserted into the receptacle, the plunger is actuated to cause the receptacle to become energized.

However, when a plug is mechanically inserted into the interlocking outlet, electrical issues may still be present at the interlocking outlet such as, without limitation, a lack of electrical continuity or various electrical faults with the power at the interlocking outlet. These electrical issues can present safety concerns if the receptacle is energized. Prior interlocking outlets do not sense or indicate the presence of such electrical issues, and thus, a user may proceed to energize the outlet when such issues are present.

There is therefore room for improvement in interlocking outlets.

There is also room for improvement in methods of operating interlocking outlets.

SUMMARY

In accordance with one aspect of the disclosed concept an interlocking outlet comprises: terminals configured to electrically connect to a power source; a receptacle structured to receive a plug; at least one sensor; and a control unit structured to determine whether an electrical condition is met and the plug is physically inserted into the receptacle based on outputs of the at least one sensor and to electrically connect the receptacle to the terminals when the electrical condition is met and the plug is physically inserted into the receptacle to energize the receptacle.

In accordance with another aspect of the disclosed concept, a method of operating an interlocking outlet is provided. The interlocking outlet includes terminals structured to electrically connect to a power source and a receptacle structured to receive a plug. The method comprises: receiving a plug insertion sensor output indicating whether a plug is inserted into the receptacle; receiving an electrical condition sensor output including information associated with one or more electrical conditions of power at the interlocking outlet; determining whether the one or more electrical conditions are met and whether the plug is inserted into the receptacle; and in response to determining that the electrical condition is met and the plug is inserted into the interlocking outlet, outputting a signal to electrically connect the receptacle to the terminals to energize the receptacle.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
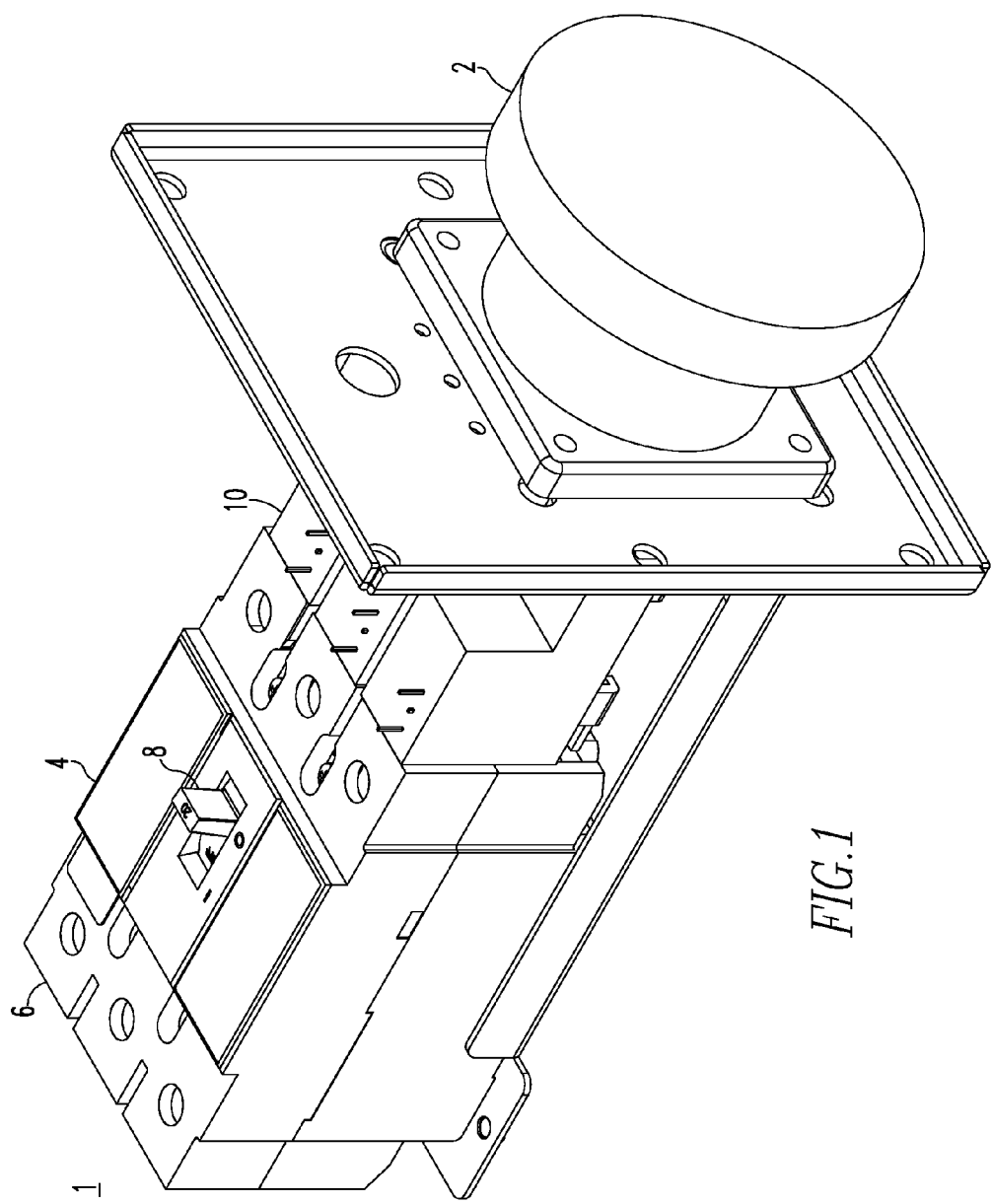
FIG. 1 is an isometric view of an interlocking outlet in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the term "number" shall mean one or an integer greater than one (i.e., a plurality).

As employed herein, the statement that two or more parts are "coupled" together shall mean that the parts are joined together either directly or joined through one or more intermediate parts.

As employed herein, the term "processor" shall mean a programmable analog and/or digital device that can store, retrieve, and process data (e.g., without limitation, a computer; a workstation; a personal computer; a controller; a digital signal processor; a microprocessor; a microcontroller; a microcomputer; a central processing unit; a mainframe computer; a mini-computer; a server; a networked processor; a programmable logic controller; or any suitable processing device or apparatus).

Figure 2:
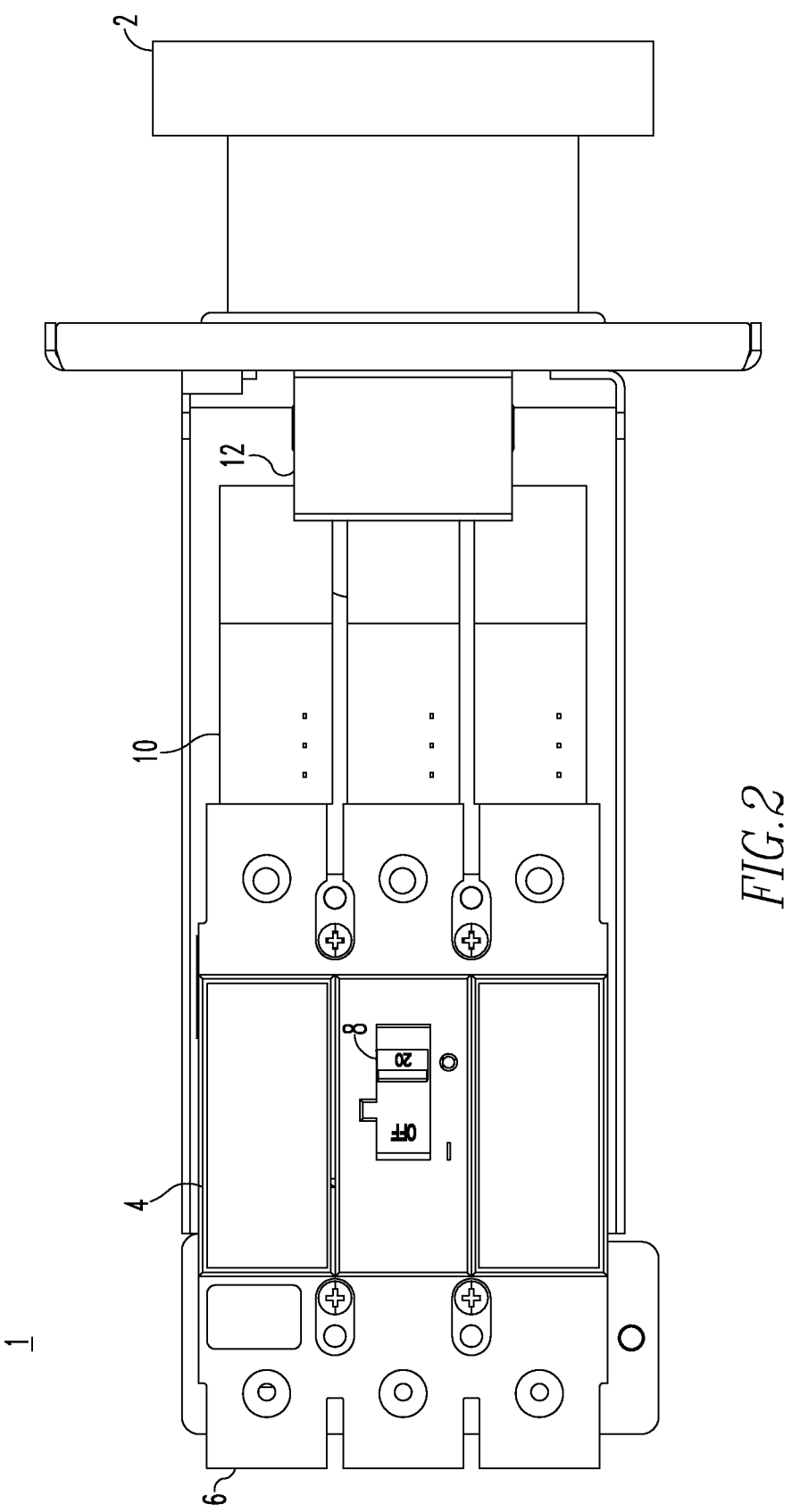
FIG. 2 is a top view of the interlocking outlet of FIG. 1.
Figure 3:
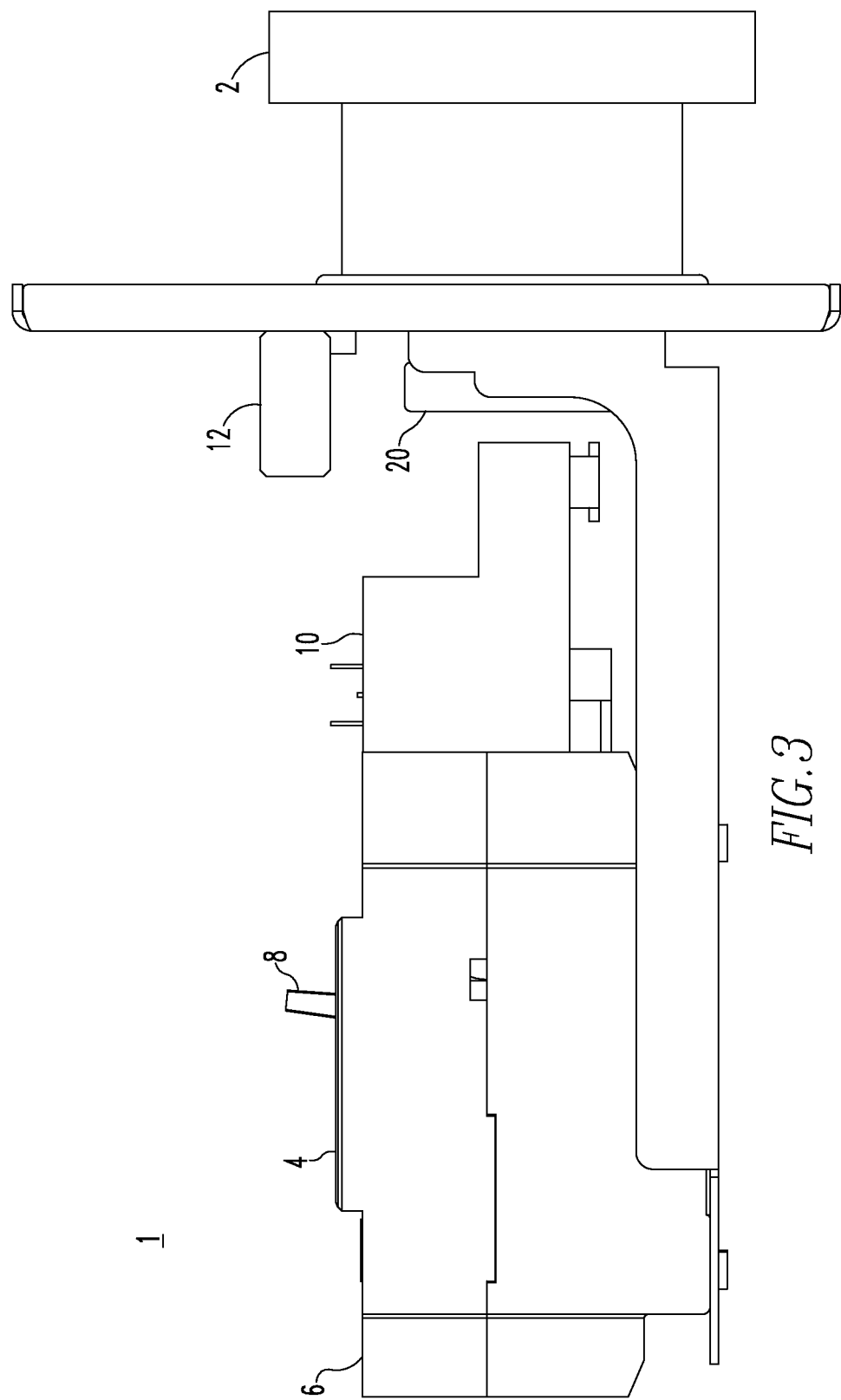
FIG. 3 is a side view of the interlocking outlet of FIG. 1.
Figure 4:
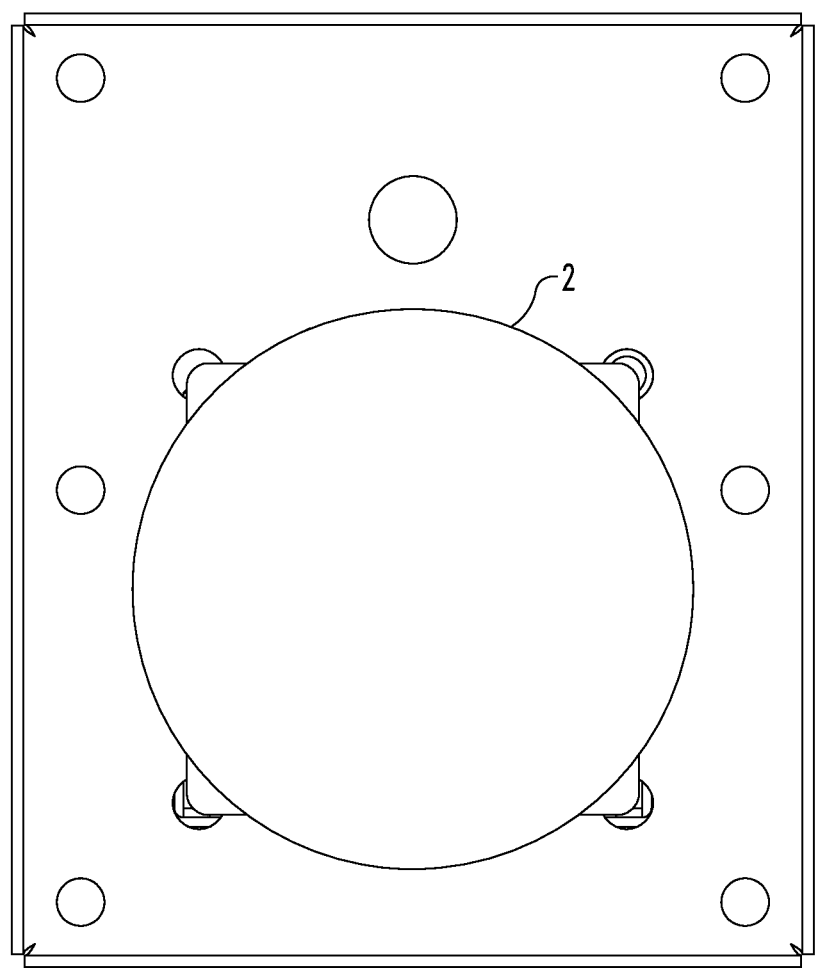
FIG. 4 is a front view of the interlocking outlet of FIG. 1.

FIG. 1 is an isometric view of an interlocking outlet 1 in accordance with an example embodiment of the disclosed concept. FIG. 2 is a top view of the interlocking outlet 1 of FIG. 1. FIG. 3 is a side view of the interlocking outlet 1 of FIG. 1, and FIG. 4 is a front view of the interlocking outlet 1 of FIG. 1.

Figure 5:
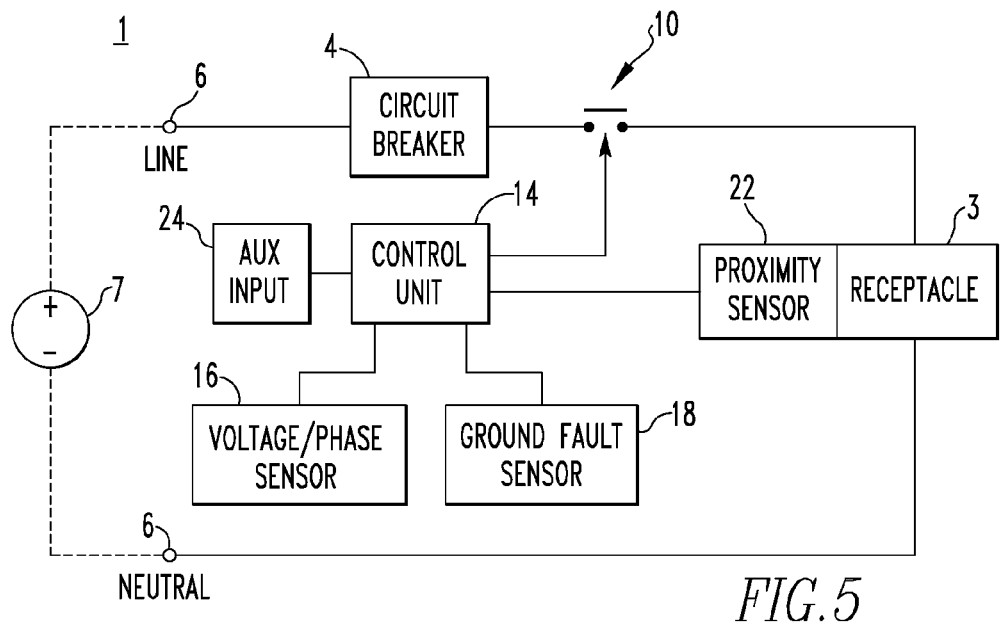
FIG. 5 is a block diagram of an interlocking outlet in accordance with an example embodiment of the disclosed concept.

The interlocking outlet 1 includes a receptacle cover 2 that covers a receptacle (hidden behind the receptacle cover 2 in FIG. 1; shown in block form in FIG. 5). The receptacle is configured such that an electrical plug (not shown) may be physically inserted into it and make electrical contact with conductors inside the interlocking outlet 1. The receptacle cover 2 is configured to open to allow access to the receptacle 3.

The interlocking outlet 1 also includes terminals 6. The terminals 6 are conductive members that are configured to electrically connect to conductors such as LINE and NEUTRAL conductors associated with a power source 7 (shown in FIG. 5). The interlocking outlet 1 also includes a circuit breaker 4. The circuit breaker 4 is disposed on a conductive path between the terminals 6 and the receptacle 3. The circuit breaker 4 includes a switch 8 (e.g., without limitation, an operating handle) configured to toggle operation of the circuit breaker 4. Opening the circuit breaker 4 electrically disconnects the receptacle 3 from the power source 7.

The interlocked outlet 1 further includes a relay 10. The relay is disposed between the circuit breaker 4 and the receptacle. The relay 10 is configured to shut off power to the receptacle 3 if there is an issue detected with the power being supplied to the receptacle 3.

Referring to FIG. 2, the interlocking outlet 1 further includes a control unit housing 12. The control unit housing 12 is structured to hold a control unit 14 (see FIG. 5). The control unit housing 12 may be composed of any material suitable for housing the control unit 14.

Turning to FIG. 5, a block diagram in schematic form of the interlocking outlet 1 of FIG. 1 is shown. As shown in FIG. 5, the control unit 14 is electrically connected to various sensors (e.g., without limitation, voltage/phase sensor 16; ground fault sensor 18; proximity sensor 22). The control unit 14 is configured to receive outputs from the sensors to determine whether electrical conditions (e.g., without limitation, proper voltage, proper phase, proper continuity, and grounding) for energizing the receptacle 3 are met. In some example embodiments of the disclosed concept, the grounding of the power to the receptacle 3 is checked via the ground fault sensor 18. Also, in some example embodiments of the disclosed concept, the voltage is checked by the voltage/phase sensor 16 and it is determined that the voltage is proper and the electrical condition to energize the receptacle 3 is met when the voltage is within 10% of the nameplate voltage of the receptacle 3.

In some example embodiments, the control unit 14 is configured to determine whether there is a proper electrical connection between the receptacle 3 and a plug (not shown) inserted into the receptacle 3. The control unit 14 is also configured to determine whether the plug is inserted into the receptacle 3. If the control unit 14 determines that the electrical conditions are met for energizing the receptacle 3 and that the plug is physically inserted into the receptacle 3, the control unit 14 outputs a control signal to cause the receptacle 3 to become energized. If the control unit 14 determines that the electrical conditions are not met for energizing the receptacle 3 or that the plug is not physically inserted into the receptacle 3, then the control unit 14 does not output the control signal (or outputs a different control signal) in order to prevent the receptacle 3 from energizing. In the embodiment of the disclosed concept shown in FIG. 5, the control unit 14 controls the relay 10 to open to prevent the receptacle 3 from energizing and controls the relay 10 to close to energize the receptacle 3.

It is contemplated that the control unit 14 may include a processor (not shown). The processor may be, for example and without limitation, a microprocessor, a microcontroller, or some other suitable processing device or circuitry, that interfaces with the memory. It is also contemplated that the control unit 14 may also include a memory (not shown). The memory can be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory.

The interlocking outlet 1 includes various sensors associated with electrical conditions such as, without limitation, a voltage and phase sensor 16 and a ground fault sensor 18. The voltage and phase sensor 16 is configured to sense the voltage and the phase of the power at the interlocking outlet 1. Any suitable sensor configured to monitor voltage and phase such as, without limitation, a D65 series phase monitoring relay manufactured by Eaton Corporation, may be employed as the voltage and phase sensor 16. In the example embodiment of the disclosed concept shown in FIG. 5, one sensor is used to sense both the voltage and phase of the power at the interlocking outlet 1. However, in some other example embodiments (not shown) of the disclosed concept, just a voltage sensor could be employed and a phase sensor could be omitted, or just a phase sensor could be employed and a voltage sensor could be omitted. In yet other example embodiments (not shown) of the disclosed concept, a voltage sensor and a separate phase sensor could be employed.

Based on outputs from the voltage and phase sensor 16, the control unit 14 determines whether the voltage and phase of power at the interlocking outlet 1 are proper. In some example embodiments of the disclosed concept, the voltage and phase of power at the interlocking outlet 1 are determined to be proper when they are within 10% of their normal operating values.

The ground fault sensor 18 is configured to determine whether there is a ground fault associated with the power at the interlocking outlet 1. The ground fault sensor 18 may include one or more current transformers such as the current transformer 20 shown in FIG. 3. It is contemplated that any suitable ground fault sensor and ground fault sensing method may be employed in the interlocking outlet 1, without departing from the scope of the disclosed concept. Based on the output of the ground fault sensor 18, the control unit determines whether a ground fault exists with the power at the interlocking outlet 1.

In the case that the voltage and phase of the power are not proper, or that there is a ground fault with the power at the interlocking outlet 1, the control unit 14 will determine that the electrical conditions for energizing the receptacle 3 have not been met. In response, the control unit 14 will control the relay 10 to open, or remain open, thus preventing the receptacle 3 from becoming energized.

While the voltage and phase sensor 16 and the ground fault sensor 18 are disclosed as sensors associated with electrical conditions, it is contemplated that any other suitable sensors or configurations of sensors associated with electrical conditions may be employed in the interlocking outlet 1 without departing from the scope of the disclosed concept. Furthermore, while voltage, phase, an ground faults have been disclosed as electrical conditions associated with determining whether to energize the receptacle 3, it is contemplated that the control unit 14 may be configured to use any other suitable electrical condition with the power at the interlocking outlet 1 to determine whether or not to energize the receptacle 3.

The interlocking outlet 1 also includes a proximity sensor 22 associated with determining whether a plug has been inserted into the receptacle 3. In some example embodiments of the disclosed concept, the proximity sensor 22 includes a mechanical switch that is actuated when the plug is physically inserted into the receptacle 3. It is contemplated, however, that any suitable type of proximity sensor or other type of sensor suitable to determine whether the plug is physically inserted into the receptacle 3 may be used without departing from the scope of the disclosed concept.

When the control unit 14 determines that both the electrical conditions are met and that the plug is inserted into the receptacle 3, the control unit 14 controls the receptacle 3 to become energized. In this manner, the electrical conditions of the power at the interlocking outlet 1 are also taken into account in determining whether to energize the receptacle 3.

In some embodiments of the disclosed concept, an auxiliary input 24 is included in the interlocking outlet 1. The auxiliary input 24 is configured to output a signal to the control unit 14 which causes the control unit 14 to de-energize the receptacle. In some example embodiments of the disclosed concept, the auxiliary input 24 may output the signal in response to an undervoltage condition or in response to a shunt trip switch being actuated.

The interlocking outlet 1 may also include a status light. The status light is visible to observers of the interlocking outlet 1. The status light may indicate whether the interlocking outlet 1 is energized or not.

In some example embodiments of the disclosed concept, the interlocking outlet 1 may also include a mechanical mechanism (not shown) to energize it, such as, without limitation, a plunger. The mechanical mechanism may be included in additional to the control unit 14. However, it is contemplated that in some example embodiments of the disclosed concept, such as the example embodiment shown in FIG. 1, the mechanical mechanism may be omitted.

Figure 6:
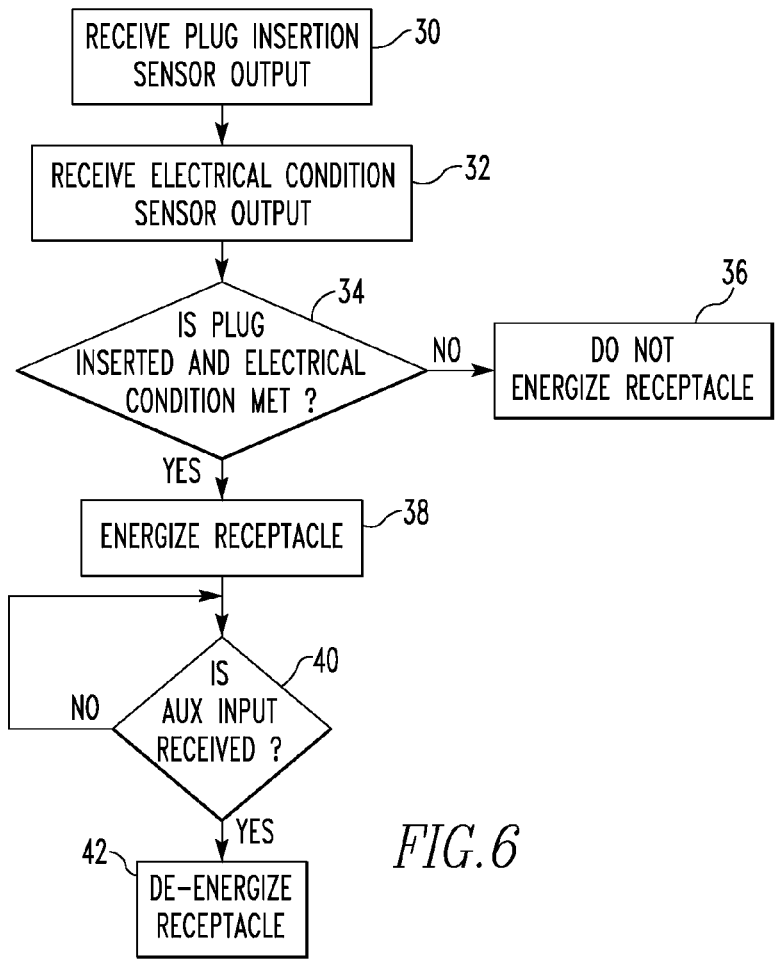
FIG. 6 is a flowchart of a method of operating an interlocking outlet in accordance with an example embodiment of the disclosed concept.

FIG. 6 is a flowchart of a method of operating an interlocking outlet in accordance with an example embodiment of the disclosed concept. The method of operating the interlocking outlet may be implemented, for example, in the interlocking outlet 1 shown in FIGS. 1-5. In particular, the method of operating an interlocking outlet may be implemented, for example, in the control unit 14 shown in FIG. 5.

At 30, the control unit 14 receives a plug insertion sensor output from, for example, the proximity sensor 22. The plug insertion sensor output indicates whether the plug is physically inserted into the receptacle 3. At 32, the control unit 14 receives the electrical condition sensor output from, for example, the ground fault sensor 18 and/or the voltage and phase sensor 16. The electrical condition sensor output provides information associated with the electrical condition of the power at the interlocking outlet 1.

At 34, the control unit 14 determines whether the plug is inserted into the receptacle 3 and whether one or more electrical conditions (e.g., without limitation, proper voltage, proper phase, proper continuity, and grounding) are met based on the received sensor outputs. If either the plug is not inserted into the receptacle 3 or the one or more electrical conditions are not met, the control unit 14 does not energize the receptacle 3 at 36. If the plug is inserted into the receptacle 3 and the electrical conditions are met, the control unit 14 energizes the receptacle 3 at 38. The control unit 14 may control whether the receptacle 3 is energized by outputting a signal to open or close the relay 10.

In some embodiments of the disclosed concept, the control unit 14 may also output an indicator signal at 38 which controls an indicator, such as a status light, to indicate when the receptacle 3 is energized.

After the receptacle 3 is energized, the control unit 14 monitors whether an auxiliary input signal is received at 40. If the auxiliary input signal is received, the control unit 14 de-energizes the receptacle 3 at 42. The auxiliary input signal may be received, without limitation, in response to an undervoltage condition or in response to a shunt trip switch being actuated. If the auxiliary input signal is not received, the control unit 14 remains at 40 and continues monitoring whether the auxiliary input signal has been received.

It is further contemplated that the disclosed concept can be embodied as computer readable codes on a tangible, non-transitory computer readable recording medium. The computer readable recording medium is any data storage device that can store data which can be thereafter read by a computer system. Non-limiting examples of the computer readable recording medium include read-only memory (ROM), non-volatile random-access memory (RAM), CD-ROMs, magnetic tapes, floppy disks, disk storage devices, and optical data storage devices.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An interlocking outlet comprising:
   terminals configured to electrically connect to a power source and to receive power from the power source;
   a receptacle structured to receive a plug;
   at least one sensor; and
   a control unit structured to determine whether an electrical condition is met and the plug is physically inserted into the receptacle based on outputs of the at least one sensor and to electrically connect the receptacle to the terminals when the electrical condition is met and the plug is physically inserted into the receptacle to energize the receptacle,
   wherein the control unit is structured to determine that the electrical condition is not met when a voltage of the power received from the power source is not within a first predetermined percentage of a predetermined normal operating voltage, and
   wherein the control unit is structured to determine whether the electrical condition is met and the plug is physically inserted into the receptacle without power being provided from the receptacle to the plug.

2. The interlocking outlet of claim 1, wherein the at least one sensor includes at least one of a voltage sensor, a phase sensor, a voltage and phase sensor, and a ground fault sensor.

3. The interlocking outlet of claim 1, wherein the at least one sensor includes a ground fault sensor, and wherein the ground fault sensor includes at least one current transformer.

4. The interlocking outlet of claim 1, wherein the at least one sensor includes a proximity sensor structured to sense when the plug is inserted into the receptacle.

5. The interlocking outlet of claim 1, further comprising:
   a status indicator structured to indicate when the receptacle is energized.

6. The interlocking outlet of claim 5, wherein the status indicator is a light.

7. The interlocking outlet of claim 1, further comprising:
   an auxiliary input structured to output a signal to the control unit,
   wherein the control unit is structured to electrically disconnect the receptacle from the terminals to de-energize the receptacle in response to receiving the signal from the auxiliary input, and
   wherein the auxiliary input outputs the signal based on one or more conditions.

8. The interlocking outlet of claim 7, wherein the one or more conditions include an undervoltage condition at the interlocking outlet.

9. The interlocking outlet of claim 7, wherein the one or more conditions include a shunt trip switch being actuated.

10. The interlocking outlet of claim 1, wherein the control unit is structured to determine that that the electrical condition is not met when a phase of power received from the power source is not within a second predetermined percentage of a predetermined normal operating phase.

11. A method of operating an interlocking outlet including terminals structured to electrically connect to a power source and to receive power from the power source, and a receptacle structured to receive a plug, the method comprising:
   receiving a plug insertion sensor output indicating whether a plug is inserted into the receptacle;

receiving an electrical condition sensor output including information associated with one or more electrical conditions of power at the interlocking outlet;

determining whether the one or more electrical conditions are met and whether the plug is inserted into the receptacle; and in response to determining that the electrical condition is met and the plug is inserted into the interlocking outlet, outputting a signal to electrically connect the receptacle to the terminals to energize the receptacle, wherein determining whether the one or more electrical conditions are met comprises determining the one or more electrical conditions are not met when a voltage of the power received from the power source is not within a first predetermined percentage of a predetermined normal operating voltage, and wherein determining whether the electrical condition is met and the plug is physically inserted into the receptacle is performed without power being provided from the receptacle to the plug.

12. The method of claim 11, wherein the electrical condition sensor output is received from at least one of a voltage sensor, a phase sensor, a voltage and phase sensor, and a ground fault sensor.

13. The method of claim 11, wherein the electrical condition sensor output is received from a ground fault sensor, and wherein the ground fault sensor includes at least one current transformer.

14. The method of claim 11, wherein the plug insertion sensor output is received from a proximity sensor structured to sense when the plug is inserted into the receptacle.

15. The method of claim 11, further comprising:
outputting an indication signal to control a status indicator to indicate when the receptacle is energized.

16. The method of claim 15, wherein the status indicator is a light.

17. The method of claim 11, further comprising:
determining whether an auxiliary input is received; and
in response to receiving the auxiliary input, outputting a signal to electrically disconnect the receptacle to the terminals to de-energize the receptacle.

18. The method of claim 17, wherein the auxiliary input is received in response to an undervoltage condition at the interlocking outlet.

19. The method of claim 17, wherein the auxiliary input is received in response to a shunt trip switch being actuated.

20. The method of claim 11, wherein determining whether the one or more electrical conditions are met comprises determining the one or more electrical conditions are not met when a phase of the power received from the power source is not within a second predetermined percentage of a predetermined normal operating phase.

* * * * *